United States Patent
Teneketges

(10) Patent No.: US 7,663,389 B2
(45) Date of Patent: Feb. 16, 2010

(54) AUTOMATED TEST EQUIPMENT WITH DIB MOUNTED THREE DIMENSIONAL TESTER ELECTRONICS BRICKS

(75) Inventor: Nicholas J. Teneketges, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 6 days.

(21) Appl. No.: 12/101,732

(22) Filed: Apr. 11, 2008

(65) Prior Publication Data

US 2009/0079453 A1 Mar. 26, 2009

Related U.S. Application Data

(62) Division of application No. 10/882,467, filed on Jun. 30, 2004, now Pat. No. 7,375,542.

(51) Int. Cl.
*G01R 31/02* (2006.01)
(52) U.S. Cl. .................................................. 324/760
(58) Field of Classification Search ............... 324/73.1, 324/158.1, 750–765, 527–537; 327/351; 714/733, 724
See application file for complete search history.

(56) References Cited

U.S. PATENT DOCUMENTS

| | | | |
|---|---|---|---|
| 4,517,512 | A | 5/1985 | Petrich et al. |
| 5,380,956 | A | 1/1995 | Loo et al. |
| 5,426,563 | A | 6/1995 | Moresco et al. |
| 6,040,691 | A | 3/2000 | Hanners et al. |
| 6,078,187 | A | 6/2000 | Hanners et al. |
| 6,215,320 | B1 | 4/2001 | Parrish |
| 6,275,962 | B1 * | 8/2001 | Fuller et al. .................. 714/724 |
| 6,426,559 | B1 | 7/2002 | Bryan et al. |
| 6,486,693 | B1 | 11/2002 | Conner et al. |
| 6,617,867 | B2 | 9/2003 | Buno et al. |
| 6,717,812 | B1 | 4/2004 | Pinjala et al. |
| 7,009,381 | B2 | 3/2006 | Jacobsen et al. |
| 7,046,207 | B2 | 5/2006 | Takahashi |
| 7,053,648 | B2 | 5/2006 | DeVey |
| 7,075,325 | B2 | 7/2006 | Park et al. |
| 7,084,659 | B2 | 8/2006 | Delucco et al. |
| 7,174,490 | B2 * | 2/2007 | Evans .......................... 714/724 |
| 7,482,825 | B2 * | 1/2009 | Lopez et al. ................. 324/760 |
| 2006/0071680 | A1 * | 4/2006 | Behziz et al. ................ 324/765 |

FOREIGN PATENT DOCUMENTS

| | | |
|---|---|---|
| WO | WO 00/73905 | 12/2000 |
| WO | WO 03/052436 | 6/2003 |

* cited by examiner

*Primary Examiner*—Ha Tran T Nguyen
*Assistant Examiner*—Trung Q Nguyen
(74) *Attorney, Agent, or Firm*—Christopher R. Balzan

(57) ABSTRACT

Automated test equipment is provided which includes a test head having a tester electronics bricks mounted to a device interface board. In some embodiments, support circuitry is positioned adjacent the tester electronics bricks opposite the DIB. The support circuitry may include power circuitry and/or data bus circuitry, which may be coupled to separate sides, or the same side of the tester electronics brick. A heat transfer apparatus located between the DIB and the support circuitry may be provided for cooling the tester electronics bricks. A tester electronics brick may include multi-chip modules arranged so that the edges generally define interface sides of the tester electronics brick. These sides may include a DIB interface side mounted to the DIB, a data bus interface side, a power interface side, and a heat transfer interface side. Contacts may be located at the edges of the MCMs.

20 Claims, 4 Drawing Sheets

AUTOMATED TEST EQUIPMENT WITH DIB MOUNTED THREE DIMENSIONAL TESTER ELECTRONICS BRICKS

CROSS REFERENCE TO RELATED APPLICATION

This application is a divisional of U.S. patent application Ser. No. 10/882,467, filed Jun. 30, 2004 now U.S. Pat. No. 7,375,542, by Nicholas J. Teneketges, entitled AUTOMATED TEST EQUIPMENT WITH DIB MOUNTED THREE DIMENSIONAL TESTER ELECTRONICS BRICKS, herein incorporated by reference in its entirety.

BACKGROUND

Automated Test Equipment or ATE is typically used to test a device under test or DUT, such as an integrated circuit, i.e. memory, microprocessors, etc. Current ATE architecture includes a tester main frame and a test head. A tester main frame includes power systems, cooling, and control circuitry. The test head contains most of the test circuitry and is separate from the tester main frame. The test head contacts the device under test.

Modern semiconductor devices typically have anywhere from thirty-two to over one-thousand pins, generally requiring a corresponding number of channels in the semiconductor tester to thoroughly verify the operation of the device. Each channel usually includes a signal path having the necessary electronics for sending/receiving test signals to/from a pin on the DUT. In conventional testers, to maximize component density and minimize the size of the tester, the channels are often formed on printed circuit boards and housed in a rack resident within the test head.

The test head typically includes 10-30 channel cards. Each channel card has several channels. The channel cards are connected to a device interface board or DIB, via coaxial cables. The coaxial cables are connected from an edge of the channel card to the DIB. The DIB routes the signals to/from the DUT.

The coaxial cables are typically about two feet in length. One drawback with current state of the art cables is that they can limit test performance at high frequencies. Further, high performance cables add a significant expense to the overall cost of the tester. In a typical system, there could be thousands of coaxial cables. In addition to adding to the cost of the tester, the coaxial cables contribute to the weight of the test head and require a significant amount of space within the test head.

A critical concern for semiconductor manufacturers is how to maximize use of the limited floor space available for test. Typically, stringent cleanliness requirements are imposed while testing semiconductor devices to minimize the possibility of failures due to dust or debris. To meet such requirements, the automatic test equipment resides in sophisticated clean rooms that minimize the size and number of particles according to particular applications. Because of the cost necessary to operate and maintain clean rooms, maximizing clean room floor space is essential to minimizing manufacturing costs.

SUMMARY

In certain embodiments, automated test equipment is provided which includes a test head having tester electronics bricks mounted to a device interface board. Support circuitry is positioned adjacent the tester electronics bricks and opposite the device interface board. The support circuitry may include power circuitry and/or data bus circuitry. The power and data bus circuitry may be coupled to separate sides, or the same side, of the tester electronics bricks. A heat transfer apparatus located between the device interface board and the support circuitry, may be provided for cooling the tester electronics bricks.

The tester electronics brick may include multi-chip modules secured together as a unit, with the multi-chip modules being vertically mounted to the device interface board. In certain embodiments, the multi-chip modules may be arranged so that the edges generally define interface sides of the tester electronics brick. This may include a DIB interface side mounted to the device interface board, a data bus interface side, a power interface side, and a heat transfer interface side.

In some embodiments, contacts may be located at the edges of the multi-chip modules. Thus, in some embodiments the DIB interface side has electrical contacts at a DIB edge of the multi-chip modules. As such, in some embodiments a compressible connector may be used to mount the tester electronics brick to the device interface board.

In some embodiments, a data bus may be coupled to the tester electronics brick at the data bus interface side. In one embodiment, flexible printed circuit boards are soldered to the data bus edge of the multi-chip modules to provide the data bus. In an alternate embodiment, interposers may be located between the multi-chip modules and adjacent the data bus interface side to provide the data bus.

In certain embodiments, the heat interface side has a heat transfer apparatus which has portions located between the multi-chip modules and projections located beyond the multi-chip modules. Some embodiments of the heat transfer apparatus may include heat pipes, cold plates, heat sinks, fins, or the like mounted with the multi-chip modules. A cooling line may be positioned adjacent the heat transfer interface side of the tester electronics brick. The cooling line may be mounted with the device interface board, if desired. Certain embodiments may be provided with a locking mechanism, i.e. an interference fit, a fastener, etc., for securing the projections with the cooling line.

BRIEF DESCRIPTION OF THE DRAWINGS

The features and advantages of the present invention will be better understood with regard to the following description, appended claims, and accompanying drawings where:

DESCRIPTION

Figure 1:
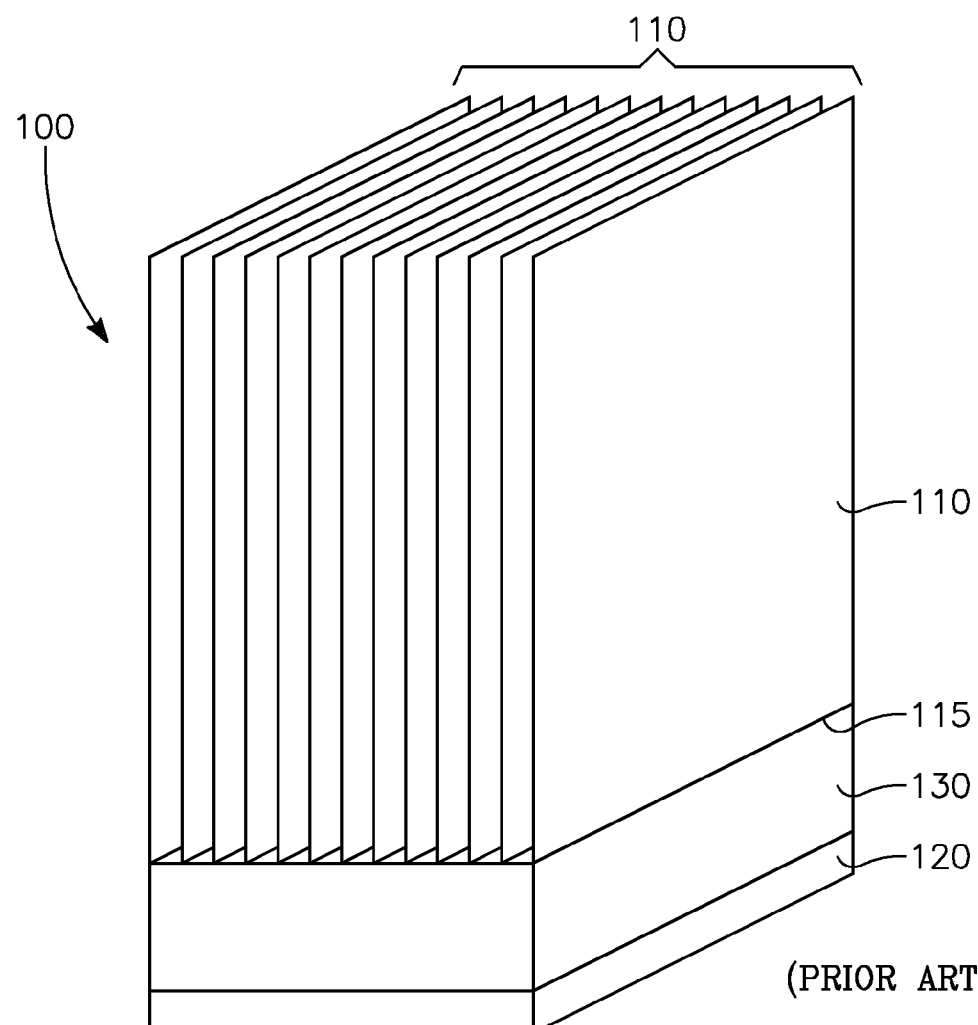
FIG. 1 shows an isometric view of a conventional configuration of channel cards for a test head.

FIG. 1 shows an isometric view of a conventional configuration of channel cards 110 for a test head 100. The pin electronics (not shown) are located on the channel cards 110. Pin electronics signals are routed through one edge 115 of each of the channel cards 110 for communication to and/or from a DIB 120. In addition, data bus lines (not shown) for control signals between the pin electronics and the tester mainframe (not shown), and for communication between the different channel cards 110, are interconnected at the edge 115 of each of the channel cards 110. Furthermore, test head power typically is supplied to the channel cards 110 via the edge 115 of each of the channel cards 110. Power supply circuitry (not shown) is typically located on the channel cards 110. If necessary, cooling lines (not shown in FIG. 1) are supplied to the channel cards 110 adjacent the edge 115 of each of the channel cards 110.

Between the DIB 120 and the channel cards 110 is a distribution area 130. Signals communicated between the pin electronics on the channel cards 110 and the DIB 120, are coupled via coaxial conductors (not shown) spanning the distribution area 130 connecting the channel cards 110 and the DIB 120. As discussed above, typically 2 to 3 feet or more of coaxial cabling is required to connect the channel cards 110 with the DIB 120.

Figure 2:
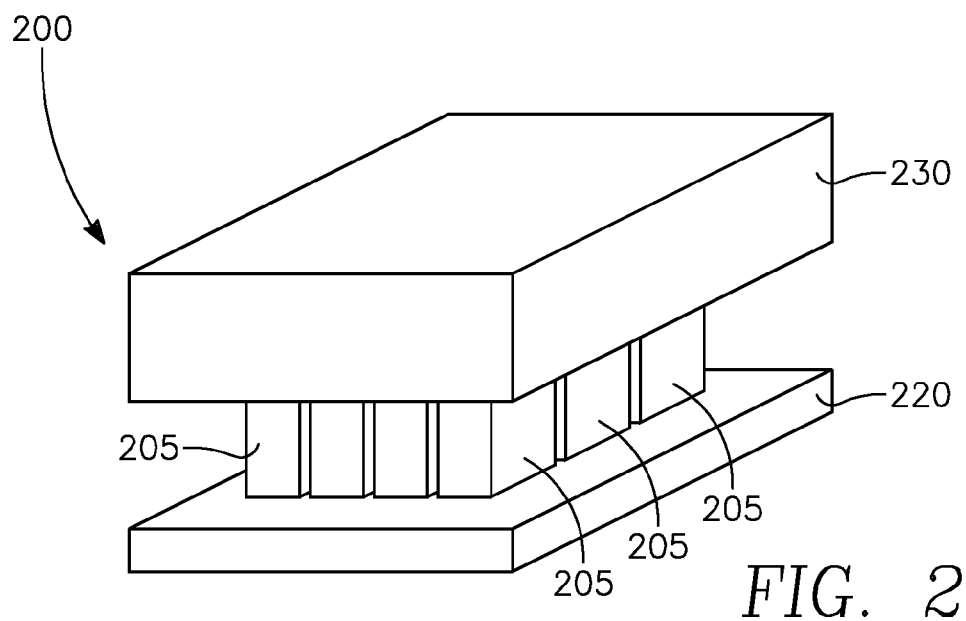
FIG. 2 shows an isometric view of a test head in accordance with one embodiment of the present invention.

FIG. 2 shows an isometric view of a test head 200 in accordance with one embodiment of the present invention. In this embodiment, the test head 200 includes multiple tester electronics bricks 205 mounted on the DIB 220. Support circuitry 230, which may include power supplies (not shown), may be located adjacent the DIB 220 without being placed between the tester electronics bricks 205 and the DIB 220.

Figure 3:
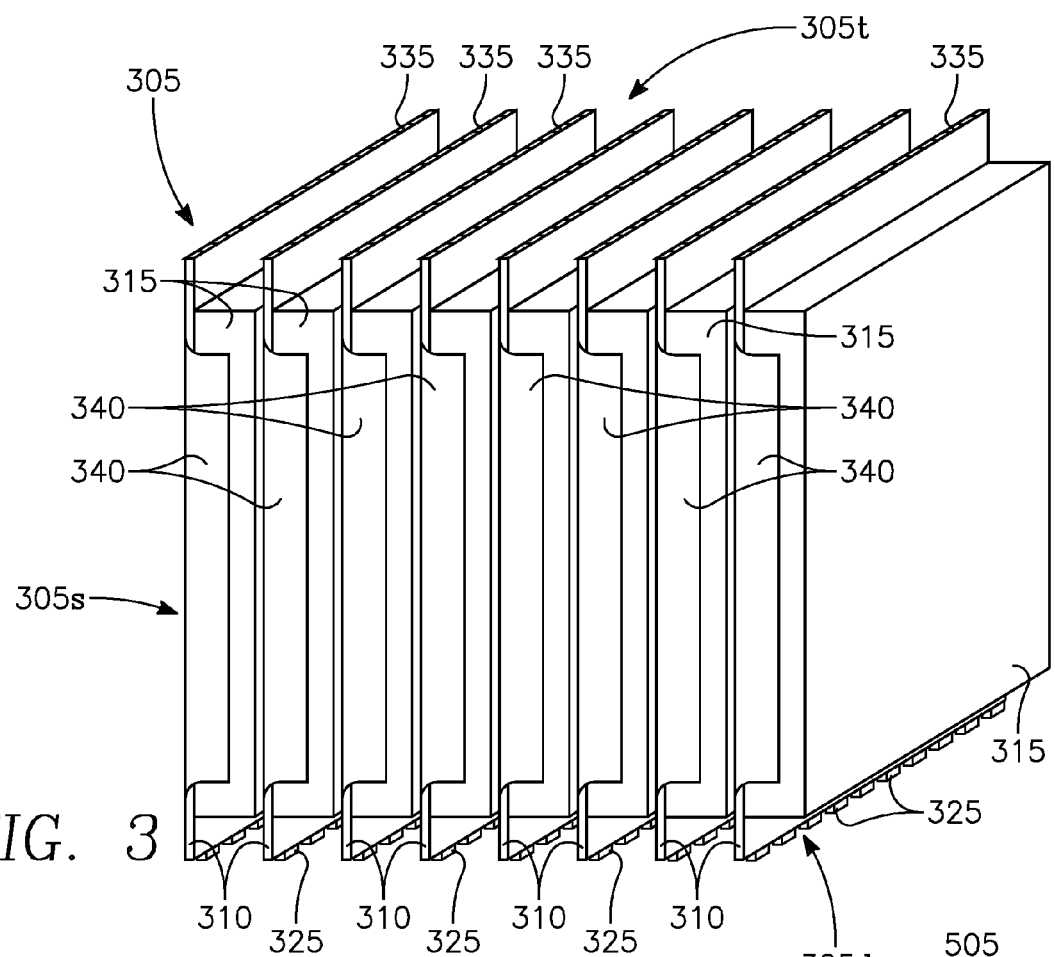
FIG. 3 shows an isometric view of one embodiment of a tester electronics brick.

FIG. 3 shows an isometric view of one embodiment of a tester electronics brick 305. In the embodiment shown, the tester electronics brick includes several MCMs or multi-chip modules 310 held together as a unit. Thus, the tester electronics brick 305 may be installed in, and replaced and/or removed from, the test head as a unit. In certain embodiments, the multi-chip modules 310 may be secured together with a separable coupling mechanism (not shown). For example, bolts, screws, brackets, interlocking fasteners, or other fasteners may be used to hold the multi-chip modules 310 together. In yet other embodiments, the multi-chip modules 310 may be coupled together with a other fasteners such as solder, glue, etc.

The multi-chip modules 310 may provide the pin electronics, interpolator electronics, data formatter electronics, pattern generation electronics, data storage, or any other circuits required to perform automated test functions. Currently available single multi-chip modules can provide tester electronics for 32 or more channels. For example, MCMs are available from IBM Corporation, located in East Fishkill, N.Y., from Kyocera Inc., located in San Diego, Calif., or other suppliers.

The multi-chip modules 310 may be formed of rigid printed circuit board with layers of wire traces (not shown) embedded within. Test signals are routed to the DIB (shown in FIGS. 6 & 7) through a DIB interface side 305*d* of the tester electronics brick 305. DIB signals may be routed through the multi-chip modules 310 to contacts 325 on the edges, or adjacent the edges, of the multi-chip modules 310 at the DIB interface side 305*d* for coupling with contacts on the DIB. Thus, the DIB interface side 305*d* may be mounted to the DIB. Because the tester electronics brick 305 may be manufactured smaller than conventional racks of channel cards, there is a relatively smaller amount of expansion and/or movement at the tester electronics brick-to-DIB interface. As such, in some embodiments the tester electronics brick 305 may be mounted to the DIB via a metal impregnated compressible elastomer such as metal particle interconnect or MPI, produced by Tyco Electronics Corporation, located in Harrisburg, Pa., http://www.tycoelectronics.com, or other elasomeric connectors, such as is available from Fujipoly America, Corp., located in Carteret, N.J., http://www.fujipoly.com. The tester electronics brick 305 may be mounted to the DIB via many connection means, including pogo pins, compliant connectors, flexible connectors, compressible connectors, solder, or other connection means.

In some embodiments, a data bus interface 305*s* is located at one side of the tester electronics brick 305. The data bus interface 305*s* allows communication between the multi-chip modules 310. In addition, control signals from a mainframe (not shown), or other controller, may be supplied through the data bus interface 305*s*, if desired.

The data bus interface 305*s* may include flexible printed wire board connectors 340 attached to extend from each of the multi-chip modules 310 to provide, or attach to a data bus (not shown), between the multi-chip modules 310. In other embodiments, not shown, conventional connectors may be coupled to the multi-chip modules 310 to allow and/or provide data bus interconnection (not shown). In yet another embodiment, elastomeric connectors, such as MPI may be located between the multi-chip modules 310 to provide interconnection between adjacent faces of the multi-chip modules 310. Other connection means are possible.

A support circuitry interface 305*t* is located at one side of the tester electronics brick 305. Contacts 335 may be located on or adjacent the edges of the multi-chip modules 310 at the support circuitry interface 305*t*. The support circuitry (not shown) may be interconnected with the tester electronics brick 305 via compressible connectors (not shown), for example an elastomeric connector such as MPI, or by other interconnection means. The support circuitry may include power supplies, test head control circuitry, clock distribution circuitry, etc. In an alternate embodiment, the support circuitry may include the data bus circuitry. Providing power and communication signals through separate faces 305*t* and 305*s* of the tester electronics brick 305, however, inhibits interference between power and communication signals.

Multi-chip modules have densely packed circuitry and may generate a significant amount of heat. As such, a heat transfer apparatus, such as cooling plates 315 may be attached to conduct heat from the multi-chip modules 310. The cooling plates 315 may be supplied with coolant via cooling lines (not shown), or otherwise coupled to a coolant supply system (not shown) for dissipating the heat generated by the multi-chip modules. In other embodiments, the heat pipes, heat sinks, fins, or other heat transfer apparatus may be located between the multi-chip modules 310. Coolant lines may be coupled, directly or indirectly, with the heat pipes, heat sinks, fins or the like. It is possible in certain embodiments that the heat transfer apparatus include spray evaporative cooling, or immersion cooling, if desired. The heat transfer interface may extend out beyond the multi-chip modules 310, for example to facilitate convective or conductive heat dissipation.

Figure 4:
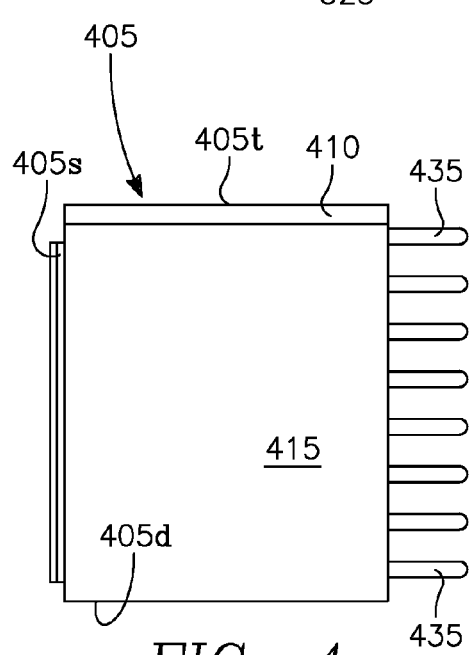
FIG. 4 shows a side view of a tester electronics brick in accordance with one embodiment of the present invention.

FIG. 4 shows a side view of a tester electronics brick in accordance with one embodiment of the present invention. In this embodiment, heat pipes 435 extend beyond the multi-chip modules 410. The DIB interface side 405*d* of the tester electronics brick 405 may be coupled to a DIB (not shown) without requiring coaxial or other cabling between the pin electronics and the DIB. The support circuitry interface may be located opposite the DIB interface 405*d*, with the data bus interface 405*s* being located along a side of the multi-chip modules 410, between the DIB interface 405*d* and the data bus interface 405*s*. In some embodiments, one or more tabs (not shown) may extend from the multi-chip modules 410 to facilitate mounting of the tester electronics brick 415 with the DIB, with the data bus cabling and/or board, or with the support cabling and/or board.

Separating the signals, i.e. power, data bus, and DUT, and routing them to different edges of the multi-chip modules 410 allows for a significant reduction in board size, as compared to routing all the signals to a single edge. In addition to more effectively utilizing the edge space as compared to single edge interface channel cards, it separates the signal types. This allows the signals supplied to the DIB to be limited to DUT signals. Reducing the number of signals on the DIB allows a reduction in the size of the DIB. It is possible in certain embodiments, however, to route some of the signals through the DIB to the tester electronics brick, for example signals between the multi-chip modules, control signals, power signals, etc., if desired.

By mounting the tester electronics bricks on the DIB, the coaxial cabling coupling the pin electronics can be eliminated. As a result, the tester electronics brick allows a significant reduction in test head size and weight as compared with conventional channel cards. Not only does this reduce size and weight of the test head, it improves its reliability as there are fewer mechanical connections. The tester electronics brick allows a reduced signal path length between the DUT and the pin electronics circuitry, reducing parasitic capacitance, impedance mismatches, and transition time along signal paths.

Furthermore, as each of the multi-chip modules 410 can have several dice (not shown), each having electronics for multiple channels, much of the electronics communications can be contained within a die and/or on a multi-chip module 410. This reduces signal path length and the number of board-to-board interconnects, reducing parasitic capacitance and improving reliability.

Figure 5:
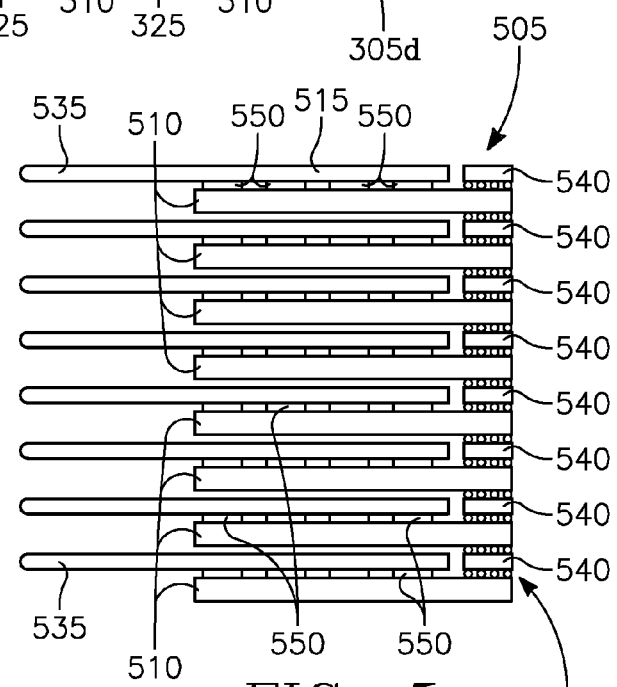
FIG. 5 shows a top view of a tester electronics brick in accordance with one embodiment of the present invention.

FIG. 5 shows a top view of a tester electronics brick 505 in accordance with one embodiment of the present invention. Multi chip modules 510 may include several chips or die 550, which may be packaged together. Or, the multi-chip modules 510 may be one or more die 550 in separate packages that are secured to a board or a substrate. In some embodiments, multiple die 550 may be mounted to a board or a substrate without a package. The multi-chip modules 510 may include die 550 which are stacked. One of many possible variations of stacked die multi-chip modules is shown in U.S. Pat. No. 6,426,559, issued Jul. 30, 2002, by Bryan et al., entitled MINIATURE 3D MULTI-CHIP MODULE, herein incorporated by reference in its entirety.

At the bus interface 505s, interposers 540 provide bus interconnection between the multi-chip modules 510. In some embodiments, the bus interface 505s may also provide interconnection between the die 550 on the same multi-chip module, as well as between different multi-chip modules 510. The interposers 540 may be formed of a metal impregnated compressible elastomer, or a rigid interconnect such as printed circuit board, or the like. In this embodiment, heat pipes 535 are shown contacting the die 550 to provide a heat transfer apparatus.

Figure 6:
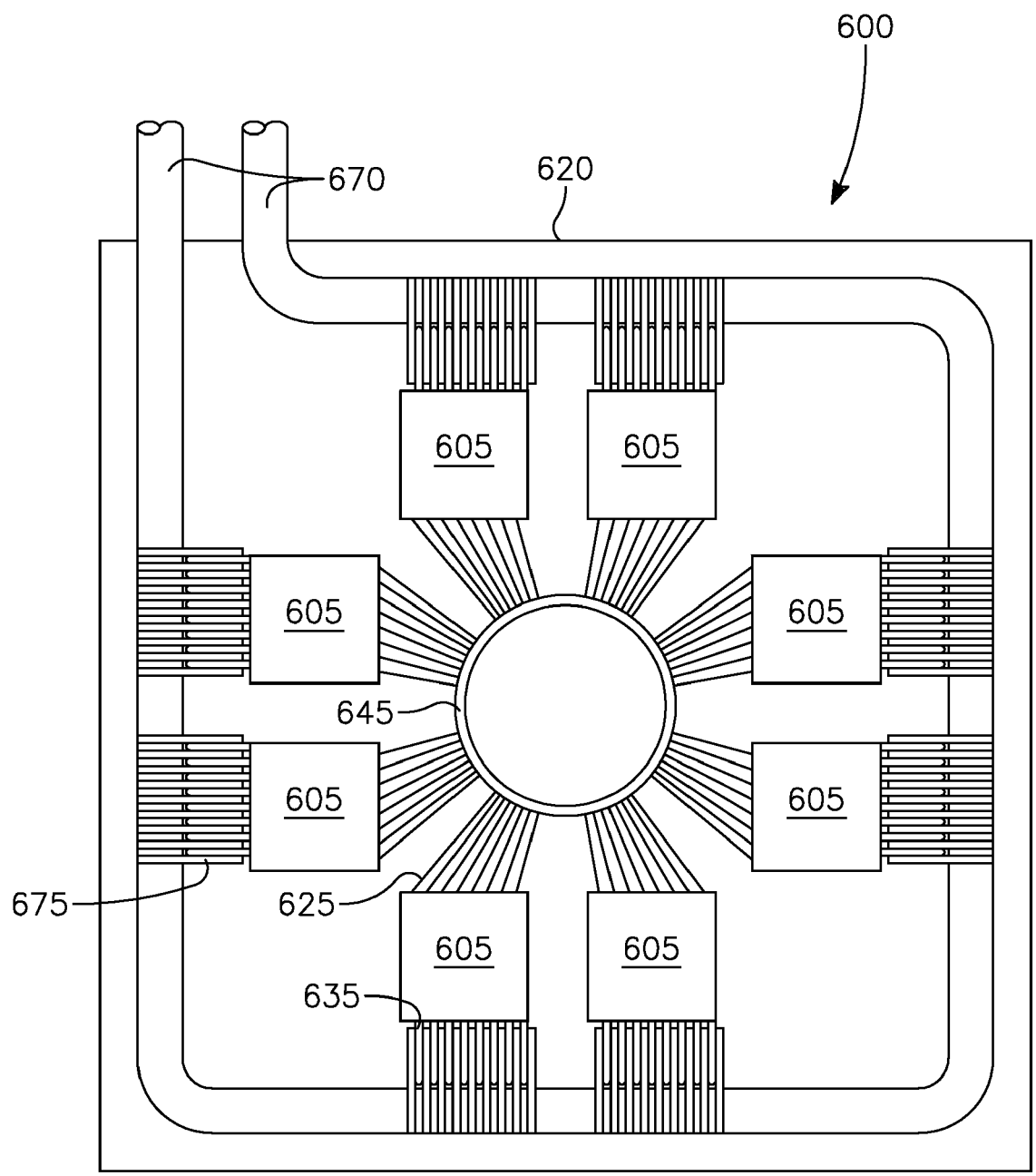
FIG. 6 is a partial cut away top view of tester electronics bricks mounted on a device interface board in accordance with one possible embodiment of the present invention.

FIG. 6 is a partial cut away top view of tester electronics bricks 605 mounted on a DIB 620 in accordance with one possible embodiment of the present invention. In this embodiment tester electronics bricks 605 are arranged on the DIB 620 around a DUT 645, such as a wafer, a chip, a die, or the like. The tester electronics bricks 605 are mounted to the DIB 620. Electrical interconnect lines 625 are routed through the DIB to the DUT 645. Not shown in FIG. 6 is the data bus interface or the power interface.

In some embodiments, eight of the tester electronics bricks 605, each with eight multi-chip modules having four 32 channel die, is sufficient to provide 2,048 channels on the DIB. As such, it is anticipated that certain embodiments of the present invention could provide at least an order of magnitude reduction in size and weight of conventional test heads.

In the embodiment of FIG. 6, each of the tester electronics bricks 605 has a heat transfer interface 635 that is thermally coupled to a coolant line 670. As shown in this embodiment, the heat transfer interface has projections 635, i.e. fins, plates, or the like, that mechanically lock with projections 675, which are attached to and extending from the coolant line 670. The projections of the heat transfer interface 635 may form an interference lock with the projections 675 of the coolant line 670. A mechanical lock, such as a bolt or a pin (not shown), may be utilized to secure the projections 635 of heat transfer interface of the tester electronics brick 605 to the projections 675 of the coolant line 670, if desired.

In some embodiments, the coolant line 670 may be utilized to provide structural rigidity by securing the tester electronics bricks 605 to the DIB 620. Thus, in certain embodiments the coolant line 670 may be secured to the DIB 620 and to the tester electronics bricks 605. Further, the coolant structure 670 and 675 could be used to support the power, data bus, or other support circuitry (not shown in FIG. 6. In some embodiments, ceramic multi-chip modules could be utilized to rigidize the tester electronics bricks 605.

Figure 7:
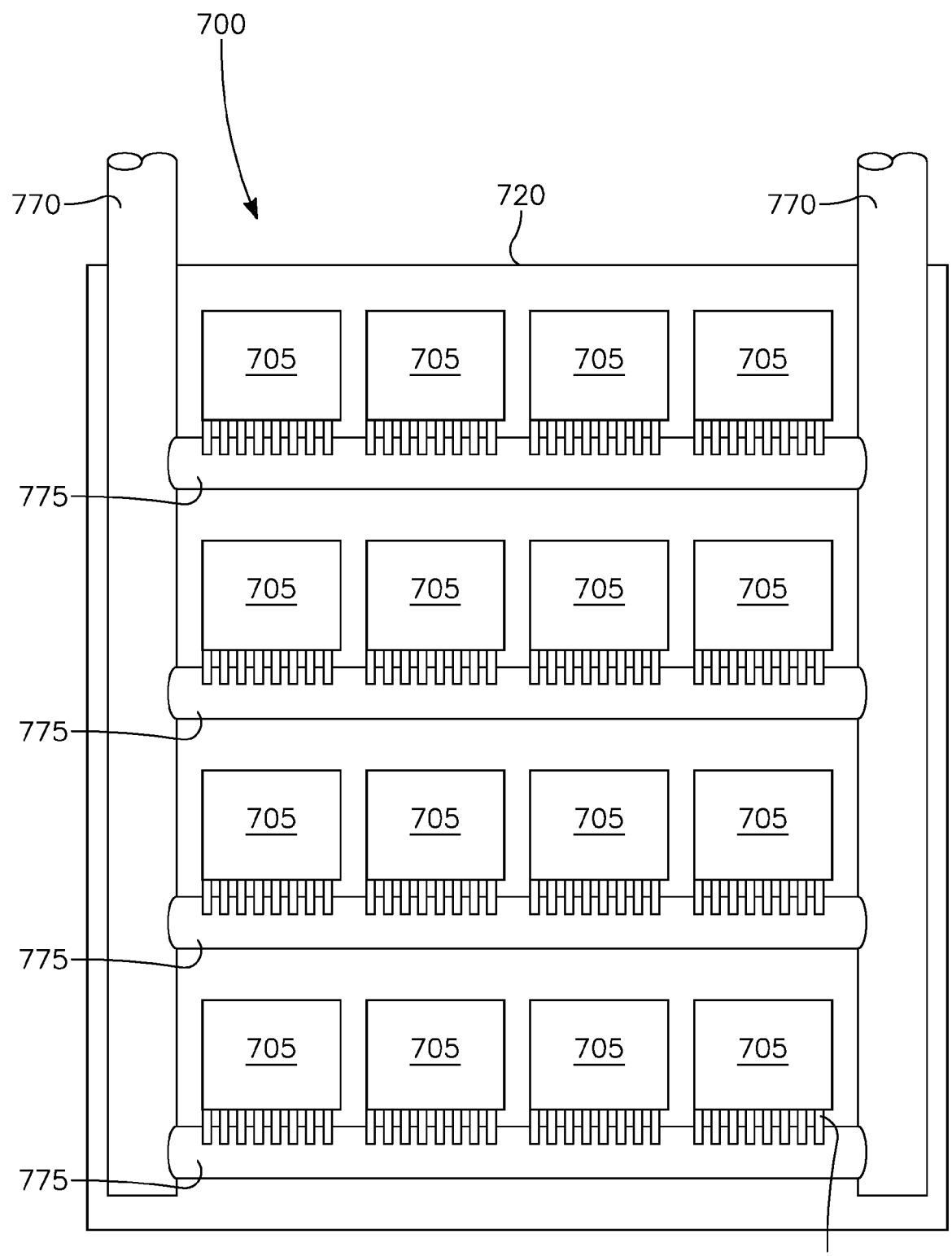
FIG. 7 shows a partial cut away top view of tester electronics bricks mounted on a device interface board in accordance with one possible alternate embodiment of the present invention.

FIG. 7 shows a partial cut away top view of tester electronics bricks 705 mounted on a DIB 720 in accordance with one possible alternate embodiment of the present invention. In this embodiment, the tester electronics bricks 705 are arranged in rows on the DIB 720 to facilitate testing of trays of packaged DUTs (not shown). The heat transfer interface 735 includes projections that extend into recesses in the coolant lines 775 to mechanically couple with the coolant lines 775.

In some embodiments, the tester electronics functions may be clustered in the tester electronics bricks. As such, it is possible in certain embodiments to provide tester electronics bricks that perform different functions. Similarly, certain tester electronics bricks may provide high performance signals, while others could provide low performance signals at lower cost, if desired.

Having described this invention in connection with a number of embodiments, modification will now certainly suggest itself to those skilled in the art. As such, the invention is not to be limited to the disclosed embodiments, except as required by the appended claims.

What is claimed is:

1. Automated test equipment comprising:
   a) a test head comprising:
      (i) a device interface board; and
      (ii) a tester electronics brick comprising:
         (1) multi-chip modules having edges, the multi-chip modules being arranged so that the edges generally define interface sides of the tester electronics brick;
         (2) a DIB interface side mounted to the device interface board;
         (3) a data bus interface side;
         (4) a power interface side; and
         (5) a heat transfer interface side.

2. The automated test equipment of claim 1 wherein the DIB interface side comprises electrical contacts at a DIB edge of the multi-chip modules.

3. The automated test equipment of claim 1 wherein the DIB interface side is mounted to the device interface board via a compressible connector.

4. The automated test equipment of claim 3 wherein the DIB interface side comprises contacts on a DIB edge of the multi-chip modules.

5. The automated test equipment of claim 1 further comprising a data bus coupled to the tester electronics brick at the data bus interface side.

6. The automated test equipment of claim 5 further comprising flexible printed circuit boards coupled to the multi-chip modules at the data bus interface side.

7. The automated test equipment of claim 6 wherein the flexible printed circuit boards are soldered to the multi-chip modules.

8. The automated test equipment of claim 5 further comprising interposers coupled between the multi-chip modules adjacent the data bus interface side.

9. The automated test equipment of claim 1 further comprising power circuitry coupled to the multi-chip modules at the power interface side.

10. The automated test equipment of claim 1 further comprising a heat transfer apparatus associated with the multi-chip modules.

11. The automated test equipment of claim 10 wherein the heat transfer apparatus comprises:
   a) portions located between the multi-chip modules; and
   b) projections extending beyond the multi-chip modules.

12. The automated test equipment of claim 11 further comprising a cooling line adjacent the heat transfer interface side of the tester electronics brick.

13. The automated test equipment of claim 12 further comprising a locking mechanism for securing the projections with the cooling line.

14. The automated test equipment of claim 12 wherein the cooling line is mounted with the device interface board.

15. The automated test equipment of claim 10 wherein the heat transfer apparatus comprises at least one of: (1) heat pipes; (2) cold plates; (3) heat sinks; or (4) fins mounted between the multi-chip modules.

16. The automated test equipment of claim 10 wherein the heat transfer apparatus comprises:
   a) a cooling line mounted with the device interface board adjacent the heat transfer interface side of the tester electronics brick; and
   b) heat pipes located between the multi-chip modules, the heat pipes comprising projections extending beyond the multi-chip modules and interlocking with the cooling line.

17. The automated test equipment of claim 1 wherein tester electronics brick is configured such that the power interface side is located opposite the DIB interface side and the bus interface side is opposite the heat transfer interface side.

18. The automated test equipment of claim 1 further comprising a heat transfer apparatus associated with the multi-chip modules comprising a cooling line adjacent the heat transfer interface side of the tester electronics brick, the heat transfer apparatus being positioned between the device interface board and power circuitry so as to be capable of supporting the power circuitry above the device interface board.

19. The automated test equipment of claim 1 further comprising the multi-chip modules being secured together as a unit.

20. The automated test equipment of claim 1 wherein the test head further comprises a plurality of the tester electronics bricks mounted to the device interface board.

* * * * *